United States Patent [19]

Takagi et al.

[11] Patent Number: 4,835,497

[45] Date of Patent: May 30, 1989

[54] AC LINE FILTER

[75] Inventors: Kusuo Takagi; Yuuzaburo Inoue, both of Tokyo, Japan

[73] Assignees: Nippon Telegraph and Telephone Corporation; Sanritsu Electric Company, Ltd., both of Japan

[21] Appl. No.: 246,855

[22] Filed: Sep. 20, 1988

[30] Foreign Application Priority Data

Feb. 29, 1988 [JP] Japan ................................ 63-44201

[51] Int. Cl.$^4$ .............................................. H03H 7/09
[52] U.S. Cl. ..................................... 333/177; 333/12; 333/181; 333/185; 336/211; 336/215
[58] Field of Search ............... 333/177, 184, 185, 181, 333/24 R, 167, 168, 12; 336/69, 181, 188, 189, 211–215; 363/39, 44–48; 323/364, 365, 371

[56] References Cited

U.S. PATENT DOCUMENTS 4,378,539  3/1983  Swanson .............................. 333/177
4,779,068  10/1988  Sakamoto et al. ............... 333/177 X

OTHER PUBLICATIONS

"Power Line Wide Band Noise Filter For Customer Equipment" of Kusuo Takagi, NTT Electrical Communication Laboratory; Denshi Joho Tsushin Gakkai 70th Anniversary National Conference (1987).

Primary Examiner—Marvin L. Nussbaum
Attorney, Agent, or Firm—Lowe, Price, LeBlanc, Becker & Shur

[57] ABSTRACT

An ac line filter comprises two main cores, at least one auxiliary core disposed between the two main cores, and a pair of windings provided on the main and the auxiliary core. The main cores form shell type closed magnetic paths and enclose the auxiliary core, which forms a closed magnetic path, when the two main cores are placed one over the other. Each of the windings is wound in a concentrated manner to surround both the inner core of the main core and the auxiliary core at a location where the auxiliary core is positioned beside the main core, and is wound in a spaced manner around the inner core of the main core at a location where the auxiliary core is not positioned adjacent the main core. Each winding is divided at the center thereof and the divided ends of one winding are cross-connected with the similar divided ends of the other winding.

3 Claims, 9 Drawing Sheets

AC LINE FILTER

BACKGROUND OF THE INVENTION

1. Field of the Invention

The present invention relates to an ac line filter which rejects high frequency common noise and normal mode noise over a wide freuency band.

2. Description of Prior Art

This type of conventional ac line filters have been of a type, for example, shown in FIG. 13 in which windings are provided on a closed circular magnetic path.

In FIG. 13 and FIG. 14 depicting the equivalent circuit of FIG. 13, the ac line filter has a pair of windings 4, 4', which will be described later, connected to terminals 1,1' and 2,2'. A core 3 forming the circular closed magnetic path has effective permeability higher than a certain value over a wide frequency range, from a low frequency region to a desired high frequency region. The windings 4, 4' are wound in a direction opposite to each other at opposing locations on the closed magnetic path so that a common mode current of a high frequency which flows into the terminals 1,1' or 2,2' causes a magnetic flux in the same direction. Capacitors 5,5' bypass a normal mode current of a high frequency in opposite phase which flows into the filter through the terminals 1,1' or 2,2'. Capacitors Cg bypass the high frequency common mode current flowing into the terminals 1,1' or 2,2' to the ground through a ground terminal 7. An electrically conductive member 6 are, for example, a metal chassis or other associated metal components which are mounted close to the line filter.

Characteristics of rejecting the high frequency common mode noise current of a prior art ac line filter thus arranged is primarily governed by resonance characteristics of the bypass capacitors Cg and an inductance L+M (actually L+M is nearly equal to 2L) which is a sum of self inductances L of the respective windings 4,4' and the mutual inductance M therebetween. However, when grounding effect of the ground terminal 7 is poor or the ground terminal 7 is not grounded, the aforementioned effect of the bypass capacitors Cg is lost and the rejection characteristics is solely dependent on the aforementioned inductances only.

The self inductances of the windings on the closed circular magnetic core described above is given by an equation $L=\mu SN^2/l$ where $\mu$ is the permeability of the core, S the cross-sectional area of the core, N the turns of the windings and l the average length of the magnetic path. Thus if the inductance is to be made large to improve the noise rejection characteristics, the number of turns N is usually increased.

However, increasing the number of turns causes not only increased distributed capacitances of the windings but also stray capacitances Cs between the input and output terminals due to the fact that providing the windings on the circular closed magnetic path causes inherently short distances between the input and output terminals, thereby deteriorating the high frequency noise rejection characteristics.

Thus if the conventional ac line filter is used with the ground terminal not being grounded, then the filter will exhibit a poorer noise rejection characteristics at high frequencies because the bypass capacitors are no longer effective. Further, even when the ground terminal is grounded, the filter still has the same problem that increasing the number of turns causes increasing stray capacitances Cs between the input and output terminals of the respective windings on a circular magnetic core, which stray capacitance causes a poorer high frequency characteristics.

SUMMARY OF THE INVENTION

An object of the present invention is to provide an ac line filter, wide band noise rejection characteristics of which is not affected by not grounding the ground terminal thereof or by poor grounding effect of the ground terminal, and also is not affected by electrically conductive members such as a closely located chassis.

FIG. 1 shows a general circuit diagram of the invention. FIG. 2 illustrates a cross-sectional perspective view of the principle embodiment of an ac line filter according to the present invention. A first main core A and a second main core B form a shell type closed magnetic path, respectively. Disposed adjacent the main core is at least one auxiliary core 13 having an effective permeability higher than that of the main core, the auxiliary core 13 being disposed at two sides thereof close to the main cores. On the core portions where the main cores A,B and the auxiliary core 13 are provided side by side, windings are wound in such a way that the windings are concentrated to surround both the main core and the auxiliary core simultaneously. The windings are divided into two parts at the center of their concentrated turns. Each one of ends of one winding on one proximate portion of the cores is cross-connected with each one of similar ends of the other winding on the other proximate portion of the cores. These windings are further extended on the main cores to form relatively spaced windings thereon. In this manner, the aforementioned core assembly and the windings form an ac line filter.

Additionally, a "shell type closed magnetic path" of the present invention is referred to as a type in which a portions of the main cores A,B on which windings are provided are enclosed by the other sides 10,12 of the same main cores. Thus portion (windings 8 in FIG. 1) of the windings wound on the aforementioned proximate portions of the core is inserted into the space shown by a reference S.

The operation of the principle embodiment shown in FIG. 1 will now be described with reference to FIG. 3 and FIG. 4, where FIG. 3 is a diagram for illustrating the principle operation of the filter when a common mode noise current Nc flows into the terminals 1,1' and FIG. 4 is a diagram for illustrating the principle operation of the filter when a normal mode current S flows into the terminals 1,1'. Like elements have been given like reference numerals in these drawings.

In FIG. 3, a first winding starts from a winding 8a1 wound around one side 9 of the main core A, continues to a widing 8a2 concentrated on the main core and the auxiliary core so that the winding 8a2 surrounds both side 9 of the main core and a first side 13₁ of the auxiliary core 13 simultaneously, then further continues to a winding 8a3 concentrated on the other main core and the auxiliary core so that the winding 8a2 surrounds both a side 11 of the other main core and the second side 13₁ of the auxiliary core 13 simultaneously, reaches a winding 8a4 which are wound around one side 11 of the main core B, and arrives at the other terminal 2.

Also, a second winding starts from a terminal 1a thereof to a winding 8b1 wound around on one side 11 of the main core B, continues to a winding 8b2 concentrated on the main core and the auxiliary core 13 so that the winding $8b2$ surrounds both a side 11 of the main core and a second side $13_2$ of the auxiliary core 13 simultaneously, then further continues to a winding $8b3$ concentrated on the main core and the auxiliary core 13 so that the winding $8b3$ surrounds both a side 9 of the main core A and a first side $13_1$ of the auxiliary core 13 simultaneously, reaches a winding $8b4$ which are wound around one side 9 of the main core A, and arrives at the other terminal $2a$.

The magnetic flux $\phi$ 1N generated by the winding portions $8a1, 8a2$ of the aforementioned first winding is in the same direction as the magnetic flux $\phi'$ 2N generated in the closed magnetic path of the main core A by the winding portions $8b3$, $8b4$ of the aforementioned second winding. The magnetic flux $\phi'$ 1N generated in the closed magnetic path of the main core B by the winding portions $8b1$, $8b2$ of the aforementioned second winding is in the same direction as the magnetic flux $\phi$ 2N generated by the main core B.

Also, with the auxiliary core 13, the magnetic flux $\phi$ 3N, $\phi$ 4N generated within the auxiliary core 13 by the windings portions $8a2, 8a3$ is in the same direction as the magnetic flux $\phi'$ 3N, $\phi'$ 4N generated by portions $8b2, 8b3$ of the second windings. Thus these flux strengthen each other within the main core A,B and the auxiliary core 13 to exhibit a large inductance against the common noise current Nc.

On the other hand, the magnetic flux $\phi$ 1S caused by portions $8a1$, $8a2$ of the first winding is in a direction opposite to the magnetic flux $\phi'$ 2S generated by portions $8b3$, $8b4$ of the second winding in the closed magnetic path of the core A as shown by arrows in FIG. 4. Also, the magnetic flux $\phi'$ 1S caused by portions $8b1$, $8b2$ of the second winding is in a direction opposite to the magnetic flux $\phi$ 2S generated by portions $8a3$, $8a4$ of the first winding in the closed magnetic path of the core 8 as shown by arrows in FIG. 4.

Also, with the auxiliary core 13, the magnetic flux $\phi$ 3S, $\phi'$ 4S caused by portion $8a2$ of the first winding and portion $8b3$ of the second winding are in a direction opposite to the magnetic flux $\phi'$ 3S, $\phi$ 4S caused by portion $8b2$ of the second winding and portion $8a3$ of the first winding in the closed magnetic path of the auxiliary core 13 as shown by arrows in FIG. 4. Thus these flux weaken each other to exhibit a large inductance against the common mode noise current Nc.

Since the effective pearmeability of the auxiliary core 13, particularly that in a low frequency region is larger than that of the main core, the windings exhibit a large inductance particularly against low frequency components of the noise to improve rejection characteristics at the low frequency region. Since the portions $8a2$, $8a3$, $8b2$, $8b3$ that surround both the main core and the auxiliary core simultaneously are wound in concentrated manner, the other windings $8a1$, $8a4$, $8b1$, $8b4$ that are wound only around the main cores A,B may be wound in spaced manner, thereby permitting reduction of the distributed capacitance of the winding portions $8a2$, $8a3, 8b2, 8b3$ and the stray capacitances between the terminals.

FIG. 2 is a perspective view of a cross section of the core taken along the line X—X' in FIG. 1. In FIG. 2, the main cores A,B are arranged to form a shell type closed magnetic path so that portions of the main cores A,B on which windings are not provided are shaped to enclose both the sides 9,11 of the main cores A,B and the sides $13_1$, $13_2$ of the auxiliary core opposing to the sides 9,11, defining a cylindrical space therebetween through which the windings around the sides 9,11 and the sides $13_1, 13_2$ may be inserted. The main cores thus arranged are placed one over the other with a gap g therebetween to enclose the windings.

By this arrangement, the windings may be shielded from chassis of the ac filter or metal members positioned near the ac filter to thereby prevent deterioration of filter performances resulting from electrical coupling to the surroundings through the stray capacitances between these windings and the metal members, which have been described with the prior art filters in FIG. 14.

To actually provide the windings on the above core portions, the windings are first formed as air core coils. Then the main cores are cut into two parts at appropriate locations on opposing sides of the main core, one of which being to be provided with a winding. Otherwise, the main cores are formed as two cores equivalent to the two parts. And one of the opposing sides of the core is inserted into the air core coil so that windings comfortably occupy the space between the opposing sides. Then jointing the cores which is inserted through the air core coils to form a closed magnetic paths completes the filter assembly.

PREFERRED EMBODIMENT OF THE INVENTION

Figure 1:
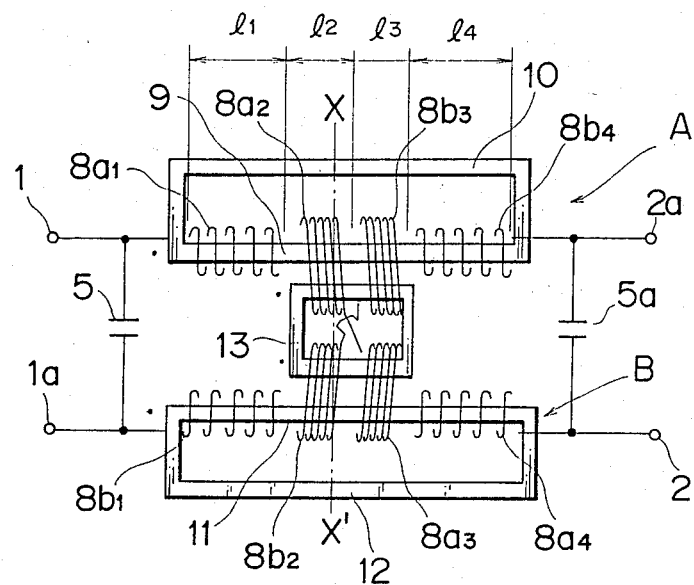
FIG. 1 is a diagram showing electrical arrangement of the principle embodiment of the present invention.
Figure 2:
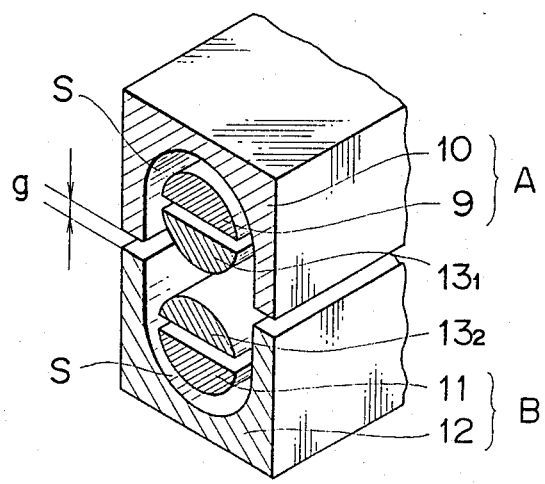
FIG. 2 is a perspective cross-sectional view taken along the line X—X' of FIG. 1.
Figure 3:
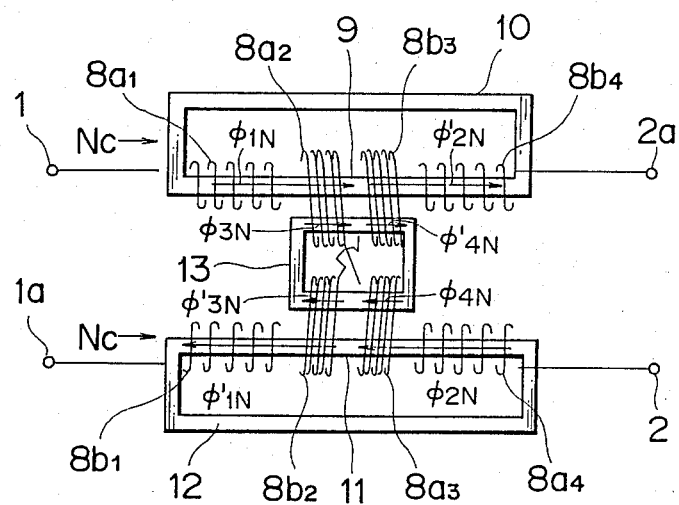
FIG. 3 and FIG. 4 is a diagram for illustrating the principle embodiment of FIG. 1.
Figure 4:
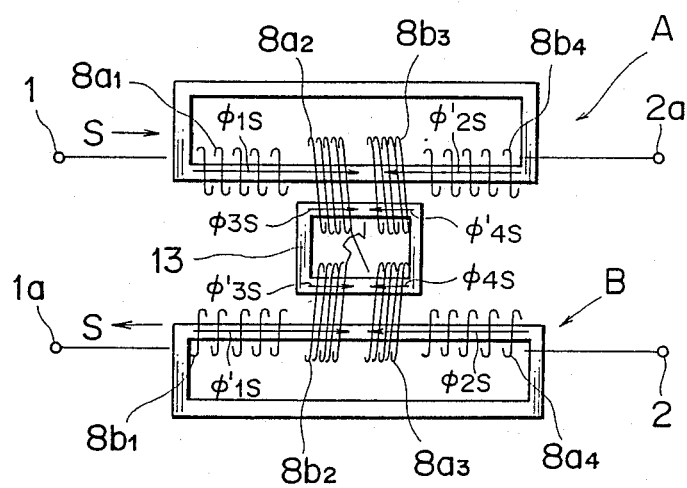
Figure 5:
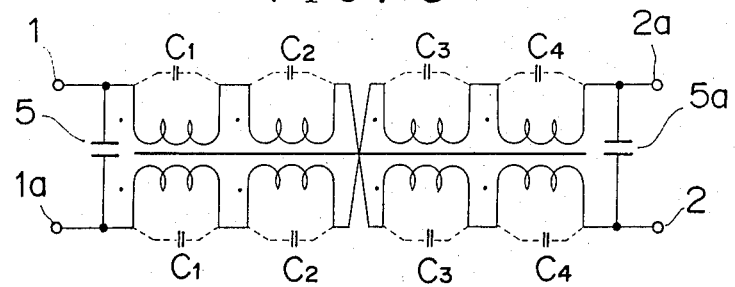
FIG. 5 is an equivalent electrical circuit diagram.

The present invention will now be described in detail by way of example with reference to the drawings. Elements having like functions have been given like reference numerals and detailed description thereof have been ommited.

Figure 6:
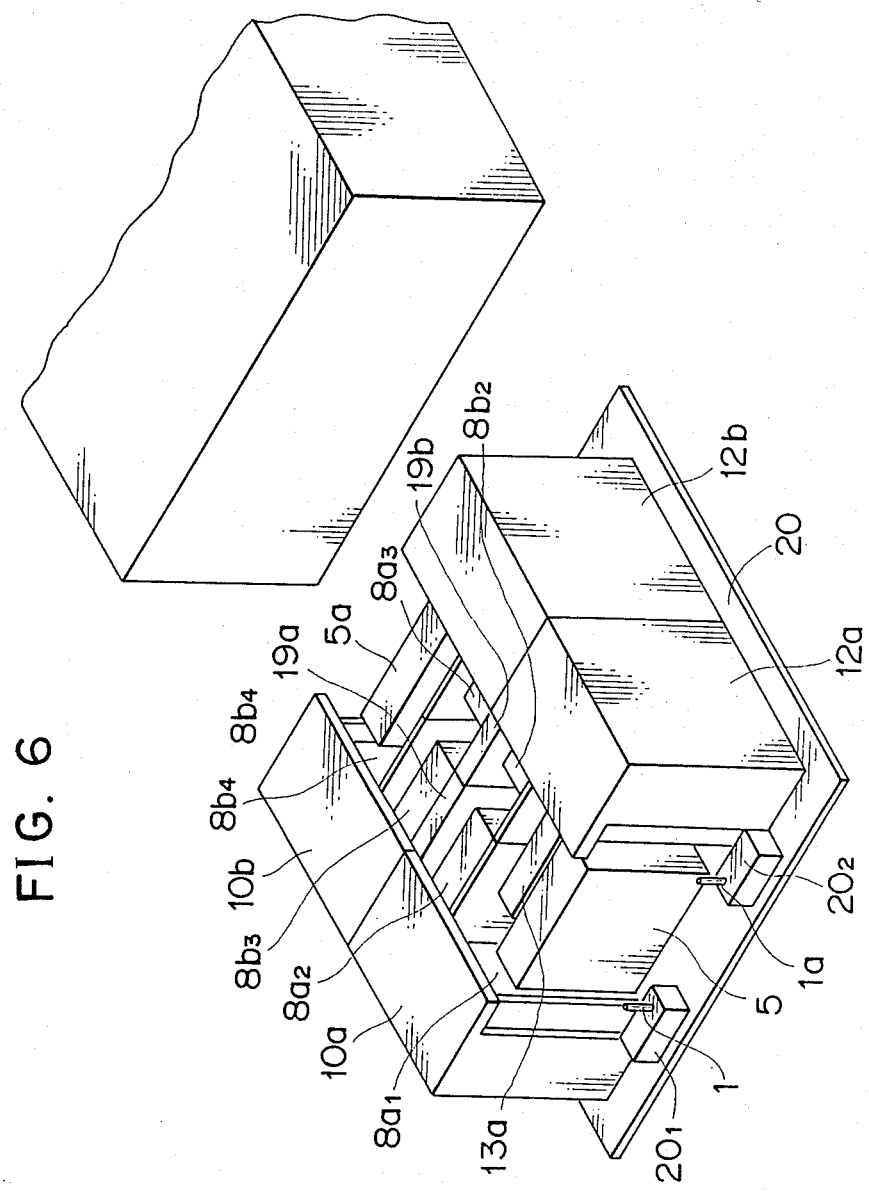
FIG. 6 is a perspective assembly diagram of a specific model of the principle embodiment of FIG. 1.
Figure 7:
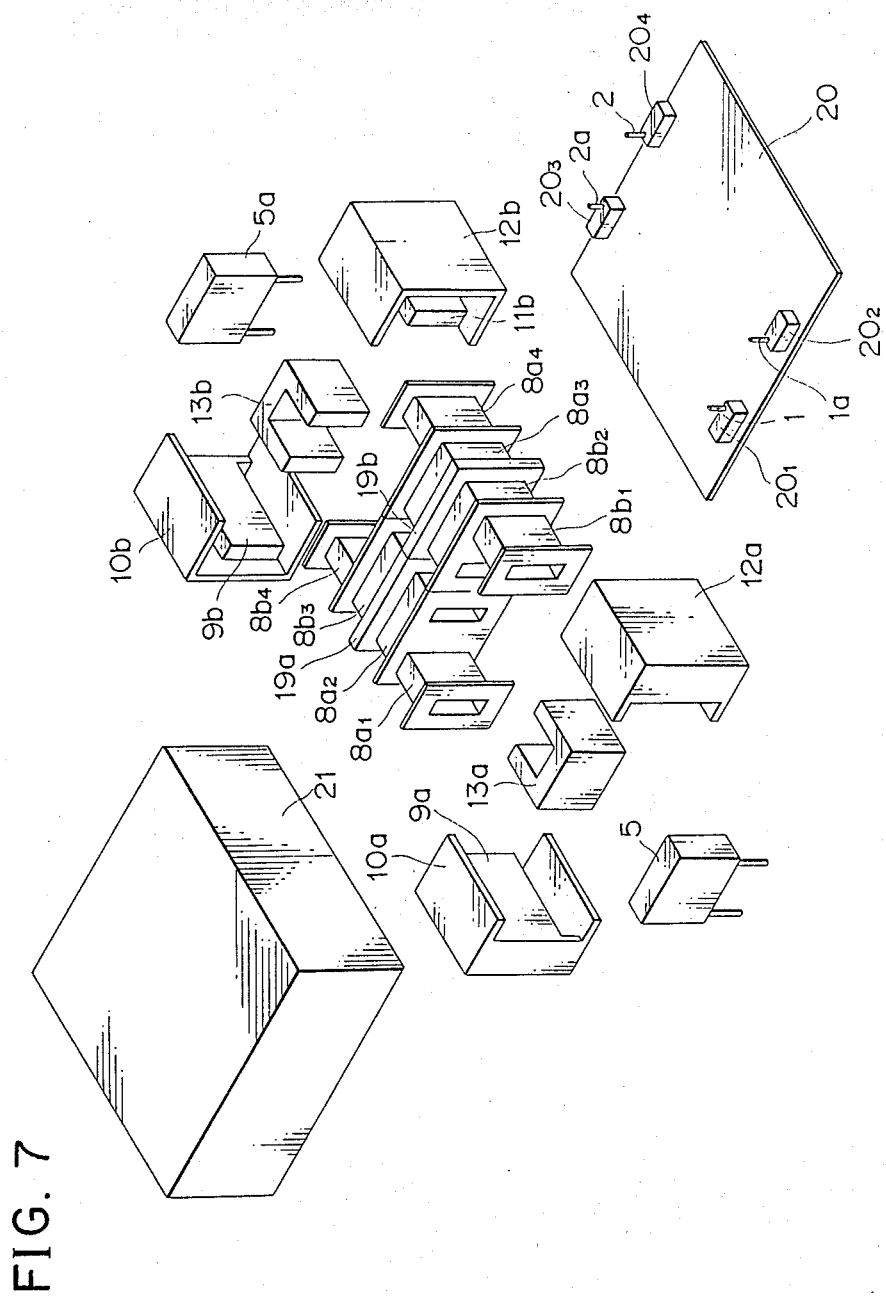
FIG. 7 is an exploded perspective view of FIG. 6.

FIG. 6 is a diagram for showing the general appearance of a specific model of an ac line filter of a principle embodiment thus far described. FIG. 7 shows the exploded view of FIG. 6. Since the electrical features thereof have been described already, the mechanical construction thereof will mainly be discussed.

In FIG. 6 and FIG. 7, inner cores $9a$, $9b$, $11a$, $11b$ have effective permeability higher than a certain value up to a high frequency region and form a rectangular closed magnetic paths around which the windings on the first main core A and the second main core B are to be wound. The first and the second main cores have outer cores $10a$, $10b$, $12a$, $12b$ which are formed to enclose the inner cores. The auxiliary core 13 has permeability equal to or higher than that of the main cores and consists of two separate portions $13a$, $13b$ to form a rectangular closed magnetic path. Bobbins have flanges 19a, 19b. Also the assembly includes an upper case and a lower case 20, 21 and capacitors 5, 5a.

The first windings consisting of 8a1, 8a2, 8a3, 8a4 and a second windings consisting of 8b1, 8b2, 8b3, 8b4 are wound on proper bobbins having holes through which the inner cores and the outer cores of aforementioned main core are to be inserted, and are aligned as shown in FIG. 7. The core members 9a, 9b, 11a, 11b, and 13a, 13b, which form the main core A, B and the auxiliary core 13, are inserted into the bobbins to form a "core-winding assembly". This core-winding assembly engages with protrusions $20_1$ to $20_4$, which supports the terminals 1, 1a, 2, 2a mounted on the lower case 20 for proper positioning.

When mounting the core-winding assembly into the case, the capacitors 5, 5a may be housed in the space between the inner cores 9a, 9b of the first main core and the inner cores 11a, 11b of the second main core for saving parts-mounting space.

Figure 8A:
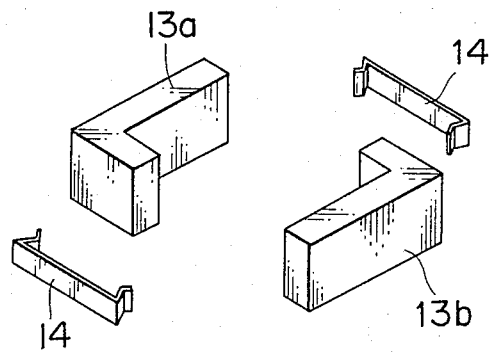
FIGS. 8a and 8b and FIGS. 9a and 9b are perspective view of examples of a main core and an auxiliary core.
Figure 8B:
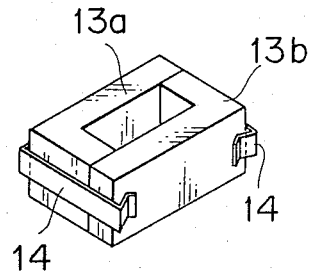
Figure 9A:
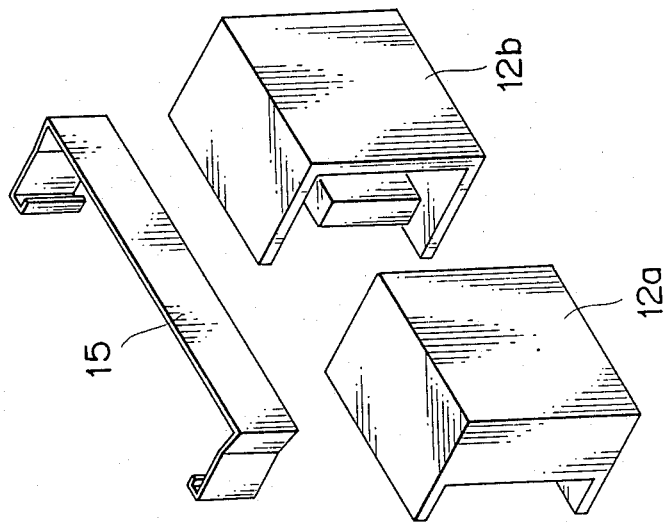
Figure 9B:
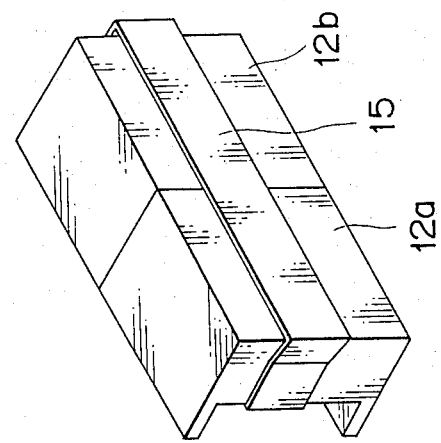

FIG. 8 shows another construction of the auxiliary core 13. Two L-shaped cores are combined and clamped by two leaf springs 14 as shown in FIG. 8a to form the auixiliary core as shown in FIG. 8b in place of the auxiliary cores divided into the U-shaped cores shown in FIG. 6 and FIG. 7. FIG. 9 shows the two core members 12a, 12b as shown in FIG. 9a, which are assembled as a unit construction by using a leaf spring 15 as shown in FIG. 9b. These constructions are advantageous in that the closed magnetic path may be assembled easily after inserting the cores into the bobbins on which windings have been provided.

Figure 10:
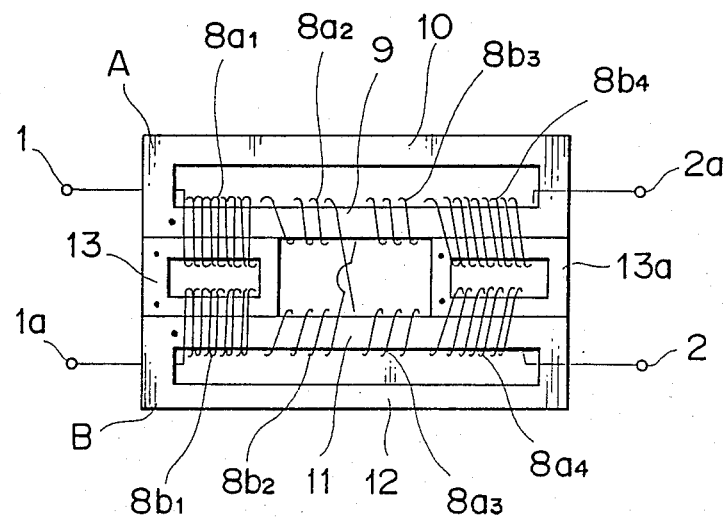
FIG. 10 is a diagram for showing an electrical arrangement of another embodiment.
Figure 11:
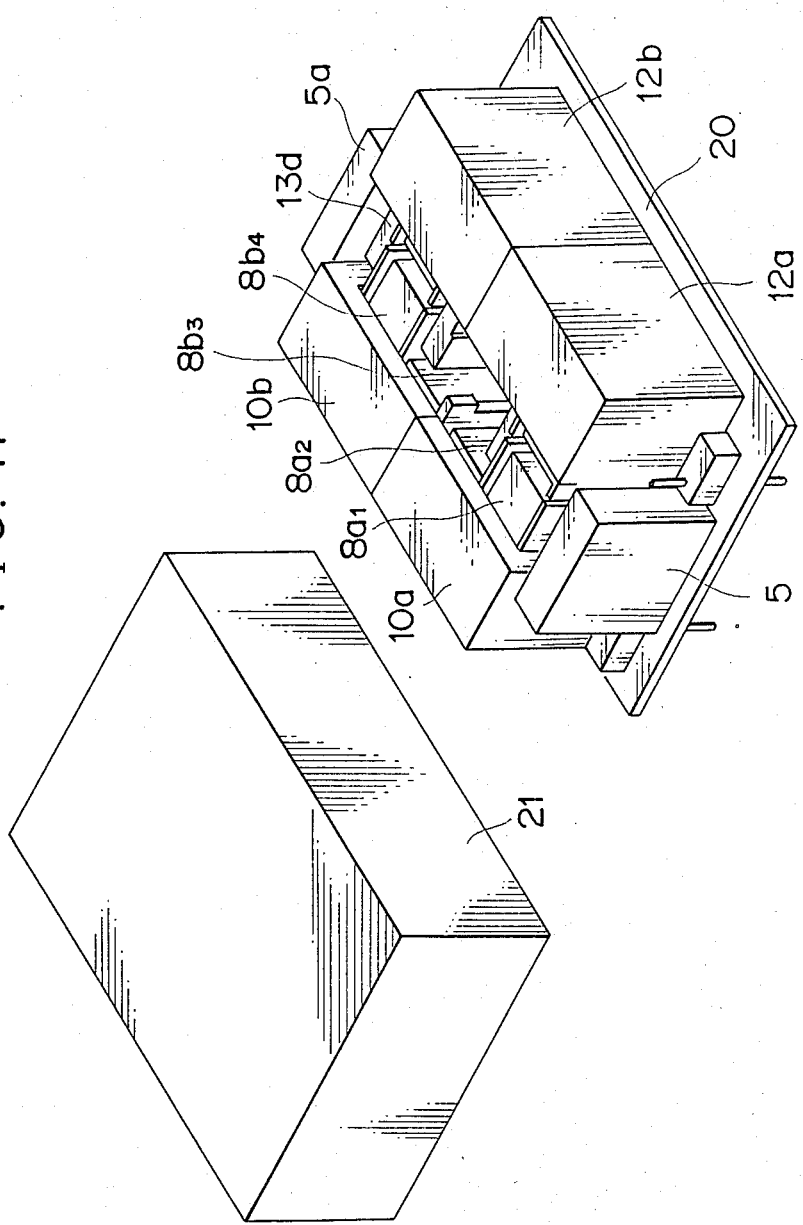
FIG. 11 is a perspective assembly view of a specific model of FIG. 10.
Figure 12:
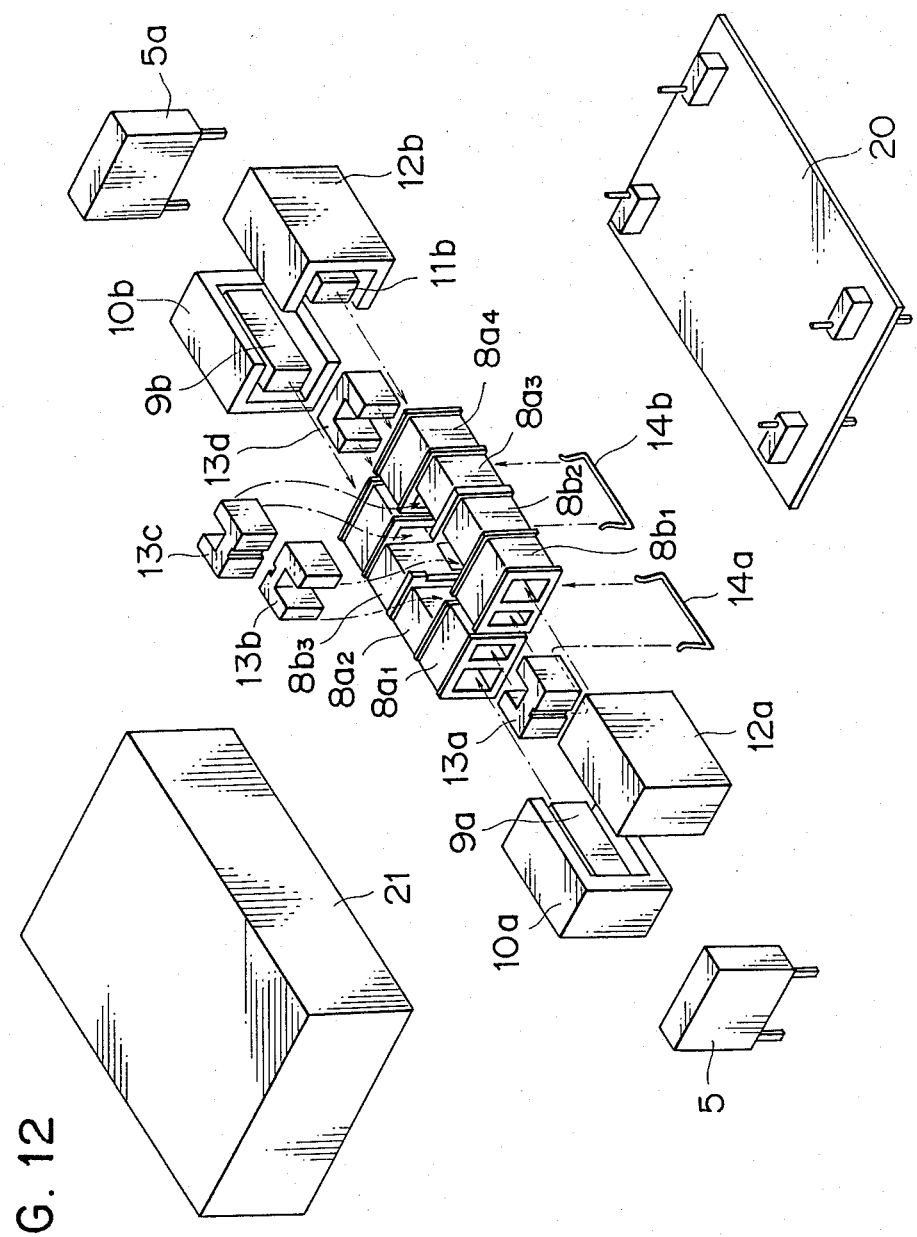
FIG. 12 is an exploded view of FIG. 11.
Figure 13:
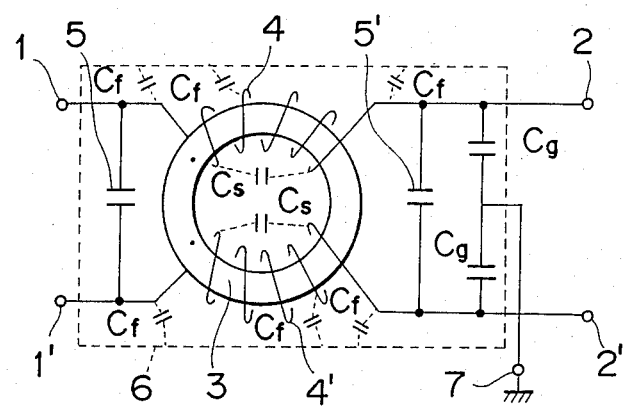
FIG. 13 and FIG. 14 are diagrams for illustrating a prior art high frequency ac line filter.
Figure 14:
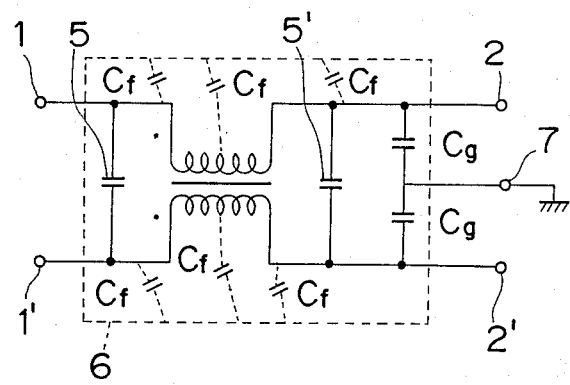

FIG. 10 to FIG. 12 show another embodiment of the present invention. FIG. 10 shows the electrical arrangement and FIG. 11 and FIG. 12 show the mechanical construction of a specific model of an ac line filter of FIG. 10.

With this embodiment, a first auxiliary core 13 and a second auxiliary core 13a, which correspond to the auxiliary core 13 in FIG. 1, are provided on both ends of the main cores A, B. One end of a first winding leaves the terminal 1 toward a winding portion 8a1 provided at a portion where one side of the auxiliary core 13 is positioned beside one side 9 of the main core A, then the winding further extends to a winding portion 8a2 on one side 9 of the main core A and then to a winding portion 8a3 on one side 11 of the main core B, the winding still further extends to a winding portion 8a4 at a portion where one side of the auxiliary core 13a is positioned beside one side 11 of the main core B, then reaches the terminal 2. One end of a second winding leaves the terminal 1a toward a winding portion 8b1 provided at a portion where one side of the auxiliary core 13 is positioned beside one side 11 of the main core B, then the winding further extends to a winding portion 8b2 on one side 11 of the main core B and then to a winding portion 8b3 on one side 9 of the main core A, the winding still further extends to a winding portion 8b4 at portion where one side 9 of the main core A is positioned beside one side of the auxiliary core 13a, then reaches the terminal 2a.

The windings on the portion where one side of the auxiliary core is positioned beside one side of the main core are of course concentrated and closely wound. Also, effective permeability of the first auxiliary core 13 may be equal to that of the second auxiliary core 13a. Desired wide band noise rejection characteristics may be obtained, if required, by using different values of permeability $\mu 1$ of the first main core A and the second main core B effective permeability $\mu 3, \mu 4$ of the first and second auxiliary cores, or modifying dimensions of the respective cores and the number of turns of the respective windings.

Further, it is apparent that forming the first main core to the fourth core with the same material, i.e., permeability $\mu 1 = \mu 3 = \mu 4$, can also be effective in implementing a wide band rejection characteristics as compared to prior art filters.

FIG. 11 is a perspective view of a specific model of FIG. 10. FIG. 12 is an exploded perspective view of FIG. 11. In FIGS. 11 and 12, reference numerals 13a, 13b denote the first auxiliary cores, reference numerals 13c, 13d denote the second auxiliary core, and reference numerals 14a, 14b denote core-retaining springs for binding these auxiliary cores 13a, 13b, 13c, 13d to construct as a unit. Description of the rest of the construction have been omitted since it should be apparent from the description referring to FIG. 6 and FIG. 7.

While the invention has been specifically been described by way of example of the preferred embodiments, these embodiments are only exemplary and various modifications may of course be made in the above described invention without departing from the scope thereof.

As thus far described, according to the present invention, minimizing the stray capacitances between the input and output terminals of the filter extends noise rejection characteristics to higher frequency region. Inductances are increased by providing the windings so that the windings surround both the main core and the auxiliary core simultaneously to extend noise rejection characteristics to the low frequency region as well. Further, the invention is also advantageous in implementing common mode noise rejection characteristics over a wide frequency band not only when bypass capacitors for grounding are not used but also when prior art grounding is not applied.

Still further, using shell type cores to form all the windings within the main core can prevent flow of noise current through stray capacitances between the windings and electrically conductive materials such metal chassis of the filter and other circuit components made of metal.

What is claimed is:

1. An ac line filter comprising:
   a pair of input terminals and a pair of output terminals;
   a first main core and a second main core, each having an inner core and an outer core for enclosing said inner core to form a shell type closed magnetic path, said main cores being disposed so that one inner core opposes the other;
   at least one auxiliary core disposed between said main cores, said auxiliary core forming a closed magentic path having two sides positioned beside the inner cores of said main cores, respectively, said auxiliary core having effective permeability higher than that of said main core; and
   a first winding and a second winding which are wound in an opposite direction to each other on said main cores and auxiliary cores, said first windings being connected between one of said input terminals and one of said output terminals and said second winding being connected between the other of said input terminals and the other of said output terminals, each winding being wound in a concentrated manner to surround both said inner core and said auxiliary core simultaneously at each of core portions where said side of the auxiliary core is positioned beside said inner core of the main core, while also being wound in a spaced manner to surround said inner core at a core portion at which said auxiliary core is not positioned adjacent, said first and second windings being divided at the center thereof, the divided ends of said first winding being cross-connected with the similar divided ends of said second winding.

2. An ac line filter according to claim 1, wherein said auxiliary core is a core positioned at the center of said inner core of said main cores.

3. An ac line filter according to claim 1, wherein said auxiliary core consists of two cores positioned with a distance therebetween.

* * * * *